US006947292B2

(12) United States Patent
Lin et al.

(10) Patent No.: US 6,947,292 B2
(45) Date of Patent: Sep. 20, 2005

(54) PRIMARY FUNCTIONAL CIRCUIT BOARD SUITABLE FOR USE IN VERIFYING CHIP FUNCTION BY ALTERNATIVE MANNER

(75) Inventors: I-Ming Lin, Taipei (TW); Kuei-Chang Huang, Taipei (TW)

(73) Assignee: Via Technologies Inc., Taipei (TW)

( * ) Notice: Subject to any disclaimer, the term of this patent is extended or adjusted under 35 U.S.C. 154(b) by 67 days.

(21) Appl. No.: 10/368,945

(22) Filed: Feb. 18, 2003

(65) Prior Publication Data

US 2003/0156393 A1 Aug. 21, 2003

(30) Foreign Application Priority Data

Feb. 19, 2002 (TW) .......................................... 91102848 A

(51) Int. Cl.⁷ ............................ H05K 7/02; H05K 7/06; H05K 7/08; H05K 7/10
(52) U.S. Cl. ....................................... 361/760; 361/764
(58) Field of Search ................................. 361/760–764, 361/777–780; 365/49–51; 706/7–11; 257/723–724; 324/754, 761, 765

(56) References Cited

U.S. PATENT DOCUMENTS

| 4,897,813 | A | * | 1/1990 | Kumbasar | ..................... | 365/49 |
| 5,959,845 | A | * | 9/1999 | Faucher | ..................... | 361/777 |
| 6,257,215 | B1 | * | 7/2001 | Kaminaga et al. | .......... | 123/647 |
| 6,427,807 | B1 | * | 8/2002 | Henneau | ..................... | 187/247 |
| 6,476,473 | B1 | * | 11/2002 | Lu et al. | ..................... | 257/685 |
| 6,578,020 | B1 | * | 6/2003 | Nguyen | ..................... | 706/15 |

FOREIGN PATENT DOCUMENTS

| JP | 1000157724 | 6/2000 |
| KR | 1998-39171 A | 8/1998 |
| KR | 2002-8731 A | 1/2002 |

* cited by examiner

*Primary Examiner*—Kamand Cuneo
*Assistant Examiner*—Tuan Dinh
(74) *Attorney, Agent, or Firm*—Thomas, Kayden, Horstemeyer & Risley

(57) ABSTRACT

A primary functional circuit board with the capability to verify the chip function by an alternative manner and a simplified design for reducing the fabrication cost includes circuit board, chip, verifying apparatus, and extending connection terminals distributed on periphery of the chip. The chip is disposed on the circuit board to execute a functional instruction of the primary functional circuit board. The extending connection terminals are the extension of connection pins of the chip. The verifying apparatus is implemented with a programmable chip having a firmware program needed for controlling the circuit under control. After the verifying apparatus is connected to the extending connection terminals, the switching device is used to select the chip or the programmable chip to control the circuit under control. The engineer can easily compare the difference between the two without a power interruption. The performance and the matching effect can be promptly known, and the desired product can be thereby developed.

5 Claims, 3 Drawing Sheets

PRIMARY FUNCTIONAL CIRCUIT BOARD SUITABLE FOR USE IN VERIFYING CHIP FUNCTION BY ALTERNATIVE MANNER

This application claims the benefit of Taiwan application Ser. No. 091102848, filed Feb. 19, 2002.

BACKGROUND OF THE INVENTION

1. Field of the Invention

This invention relates to a printed circuit board, and more particularly, the invention relates to a primary functional circuit board, which is designed in a simple structure and can be used to verify the chip function by an alternative manner.

2. Description of Related Art

In the high technology industry, the design of the integrated circuit (IC) plays an important role. Referring to FIG. 1, it is a drawing, schematically illustrating the conventional primary functional circuit board implemented with an IC. So called, the primary functional circuit board refers to a circuit substrate board with the specific function, such as the graphics card, sound card, network card or the mother board of the computer, in which the circuit substrate board has been implemented with a processor capable of the specific control function. Particularly, it can include the devices such as a basic input/output system (BIOS), a firmware device, or other function devices. From the structural point of view, the functional circuit board can include the circuit board 100 and the chip 150. The circuit board 100 can be implemented with a number of electronic devices (not shown in FIG. 1), which form a circuitry controlled by the chip 150, so as to perform the requested function for the primary functional circuit board. In other words, we can treat the chip 150 as a key part of the data transmission and the control in the primary functional circuit board.

The chip 150 is incorporated with the firmware program, which has the complex function to be able to execute the instruction of the primary functional circuit board. Since the function of the chip 150 is rather complex and an add or remove of the function may be required by the user after mass production, the firmware program often needs to be modified, by making use of the property of the field programmable gate array (FPGA), and also use of the programmable chip to control the circuit under control on primary functional circuit board. Then it needs to check whether or not the primary functional circuit board has satisfied the design requirement. In this situation, if the chip 150 or the firmware program in external connection has a defect in design, then the engineers can further edit the FPGA as necessary. The firmware program after modification can then be burned into the programmable chip again to see whether or not an improvement is obtained. By using the foregoing procedure to continuously modify and test, the program for the FPGA can be set at the end. Then, the chip can be fabricated according to the considerations of the program and the possible requirement from the user in the future. As a result, the design requirement for the primary functional circuit board can be satisfied, so as to take the place of the chip 150, which has high fabrication cost, occupies much valuable space on the printed circuit board, and needs to be modified by the programmer, as well as the external read only memory (ROM).

From the foregoing description, when the FPGA program still needs to be tested repeatedly, the engineer can continuously modify the content in the programmable chip until the function operation can be assured in normal operation. Then, according to the FPGA program, the final version is used to fabricate the chip. This chip then can effectively take the place of the original chip 150 as well as the firmware program stored in the internal ROM or the firmware program stored in the external ROM, so as to achieve a more compact and cheaper product. Then, the present invention provides a method for using the sub-board associating with the FGPA and executing all of the primary function for the original chip 150 associating with the ROM on the reserved functional pins for the common connection, so as to offer easier verification of the function and the judgment of a correct or erroneous case in design.

SUMMARY OF THE INVENTION

It is therefore an object of the present invention to provide a primary functional circuit board, which can verify a functional chip by an alternative manner, so as to simplify the original function of the chip and reduce the cost and to verify the difference for the FPGA program after the chip is replaced and updated.

Another object of the present invention is to provide a primary functional circuit board, which has the capability of verifying the function with the replaced chip and the ROM by an alternative manner. The apparatus is briefly described as follows:

The primary functional circuit board capable of verifying the function with the replaced chip by an alternative manner includes a circuit board, a chip, a verifying apparatus, and a plurality of extending connection terminals implemented on the periphery of the chip. The chip is implemented on the circuit board, so as to execute the function instructions of the primary functional circuit board. Also, the plurality of extending connection terminals implemented on the same circuit board are respectively electrically connected with the pins of the chip in pair, one by one, so as to serve as an extension of the functional pins. Furthermore, the verifying apparatus includes a substrate, a programmable chip, and a plurality of contact terminals distributed on the periphery of the programmable chip. The programmable chip is implemented on the substrate, and the connection pins of the programmable chip are respectively connected electrically with the contact terminals one by one. The function of the programmable chip can be connected to the external part for use via the contact terminals, wherein the programmable chip has been burned with the firmware program used to control the circuit under control. When contact terminals of the connector are respectively coupled to the extending connection terminals one by one, the circuit under control can be selected via the switching device controlled by the chip or the programmable chip. This allows the engineer to easily compare-the differences under control for the chip of the circuit under control or the programmable chip, so as to achieve the function to cross check without power interruption.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1:
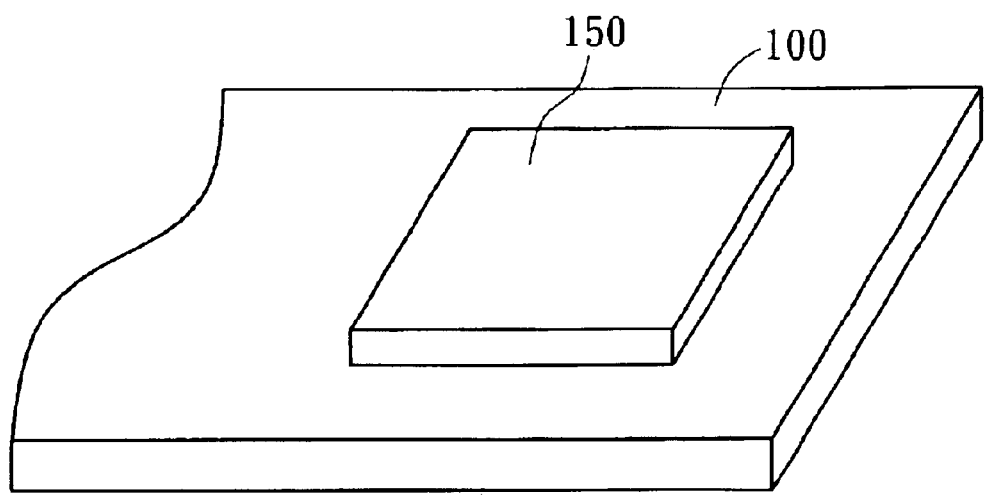
FIG. 1 is a drawing, schematically illustrating the conventional primary functional circuit board implemented with an IC.
Figure 2:
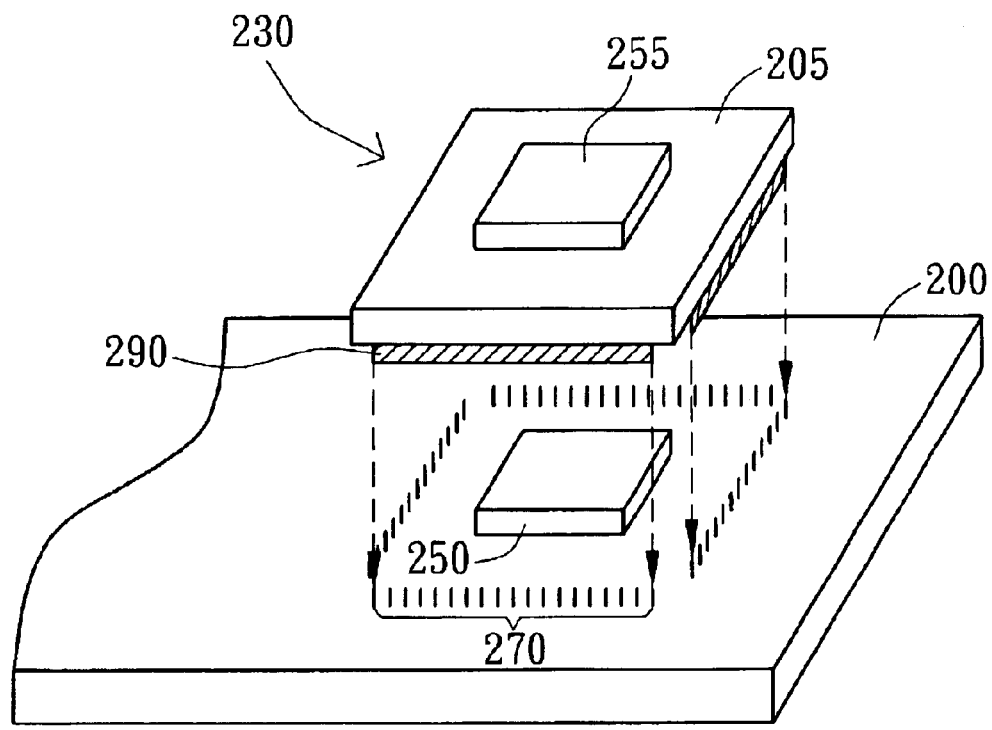
FIG. 2 is a drawing, schematically illustrating the primary functional circuit board with the capability to verify the chip function by an alternative manner, according to a preferred embodiment of the present invention.

FIG. 2 is a drawing, schematically illustrating the primary functional circuit board with the capability to verify the chip function by an alternative manner, according to a preferred embodiment of the present invention. The primary functional circuit board includes a circuit board 200, a chip 250, a verifying apparatus 230, and a number of extending connection terminals 270 distributed on the periphery of the chip 250, wherein the chip 250 can be an embedded controller in the notebook computer or the control chip that needs the programming ROM. As shown in FIG. 2, the chip 250 is implemented on the circuit board 200, so as to execute the operational instructions of the primary functional circuit board. The extending connection terminals 270, implemented on the circuit board 200, are electrically coupled with the functional pins (not shown) of the chip 250 one by one, so as to serve as an extension of the functional pins. The verifying apparatus 230 includes a substrate 205, programmable chip 255, and a connector 290, and the programmable chip 255 can be a field programmable gate array (FPGA), programmable logic device (PLD), complex programmable logic device (CPLD), or another kind of chip having an internal program that can be modified. The programmable chip 255 and the connector 290 are implemented on the substrate 205, and the connector 290 is implemented with a number of contact terminals (not shown), which can be electrically coupled with the connection pins (not shown) of the programmable chip 255 one by one, so as to serve as an extending connection pins of the programmable chip 255. It should be noted that the programmable chip 255 has been burned with the necessary firmware program used to control the circuit under control. When the contact terminals of the connector 290 are respectively coupled with the extending connection terminals 270 one by one, the chip 250 or the programmable chip 255 can select the circuit under control via the switching device. This allows the engineer to easily compare the difference when the circuit under control is controlled by the chip or the programmable chip.

As an example, if the programmable chip 255 is to take the place of some functions of some programming ROMs used by the original chips 250, engineers then can modify the FPGA program first, and then burn the program into the programmable chip 255. Also, the switching device can be used to enable the programmable chip 255, so as to replace the control function of the chip 250 to determine whether or not the performance has been achieved to the designed effect. The engineer only needs to use the switching device to switch between the chip 250 and the programmable chip 255, and the FPGA program and the firmware program can be cross compared for the featuring difference for updating the primary functional circuit board. Thusly, the verification can be achieved efficiently.

Figure 3:
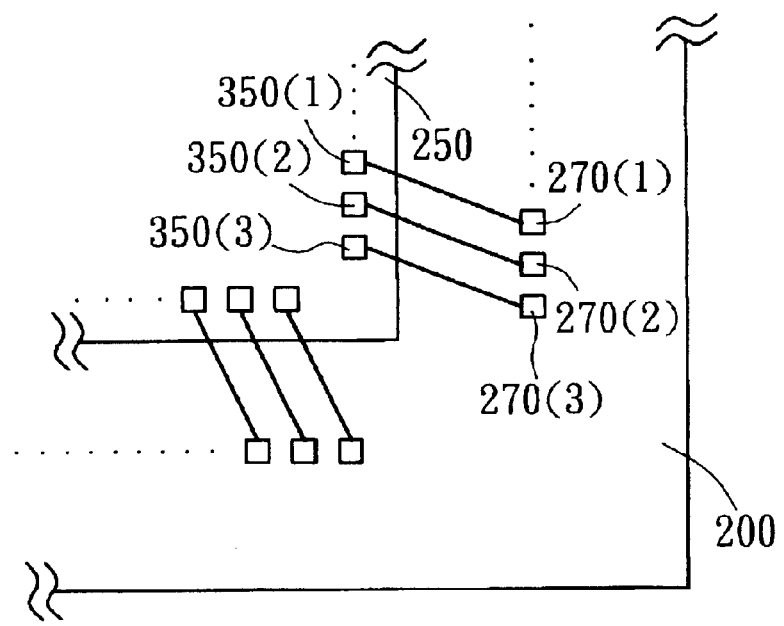
FIG. 3 is a drawing, schematically illustrating the relation between the chip, the extending connection terminals, and the circuit board in FIG. 2.
Figure 4:
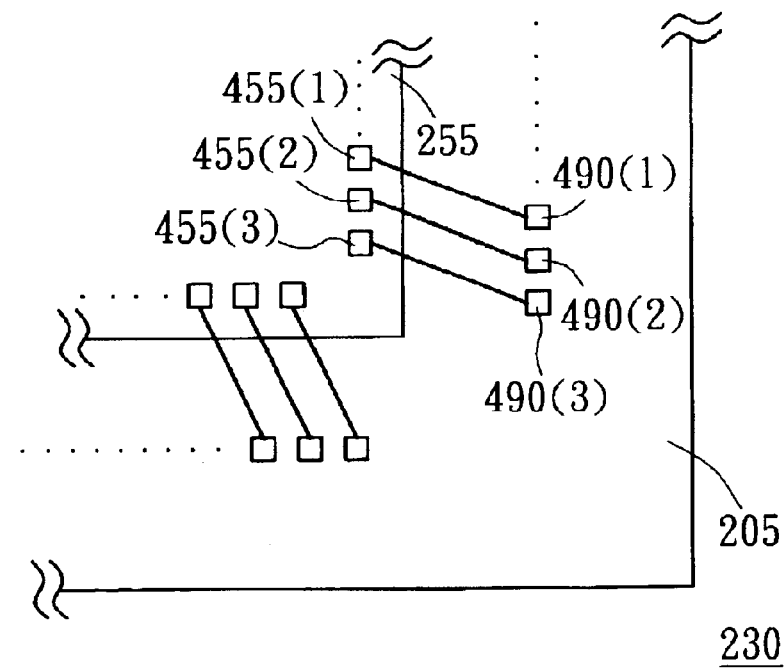
FIG. 4 is a drawing, schematically illustrating the verifying apparatus after assembly in FIG. 2.

Referring to FIG. 3, it is a drawing, schematically illustrating the relation between the chip, the extending connection terminals, and the circuit board in FIG. 2. The chip 250 and the extending connection terminals are disposed on the circuit board 200 as shown in FIG. 3. The extending connection terminals are distributed on the periphery of the chip 250 and are electrically coupled with the functional pins of the chip 250 one by one. It should be noted that since the number of the extending connection terminals and the functional pins of the chip 250 is a large number, the drawing shows only the marks of the extending connection terminals 270(1), 270(2), and 270(3), and the functional pins 350(1), 350(2), and 350(3) for clear representation and easy understanding. Further referring to FIG. 4, it is a drawing, schematically illustrating the verifying apparatus 230 after assembly in FIG. 2. The verifying apparatus 230 includes the programmable chip 255, the substrate 205 and a number of contact terminals. The programmable chip 255 and the contact terminals are disposed on the substrate 205, and the contact terminals are distributed on the periphery of the programmable chip 255 and are electrically connected to the connection pins of the programmable chip 255 one by one. Similarly, since the number of contact terminals and connection pins of the programmable chip 255 is a large number, the drawing shows only the marks of the contact terminals 490(1), 490(2), and 490(3), and the connection pins 455(1), 455(2), and 455(3) as a representation, wherein each of the connection pins is connected with the contact terminals one by one. When the verifying device 230 and the circuit board 230 are coupled together, the contact terminals on the substrate 205 can be coupled with the extending terminal on 15 the circuit board 200, and then a switching device is used for the selecting function. As a result, either the chip 250 or the programmable chip 255 can be selected for enabling, so as to control the operation of the circuit under control.

Figure 5:
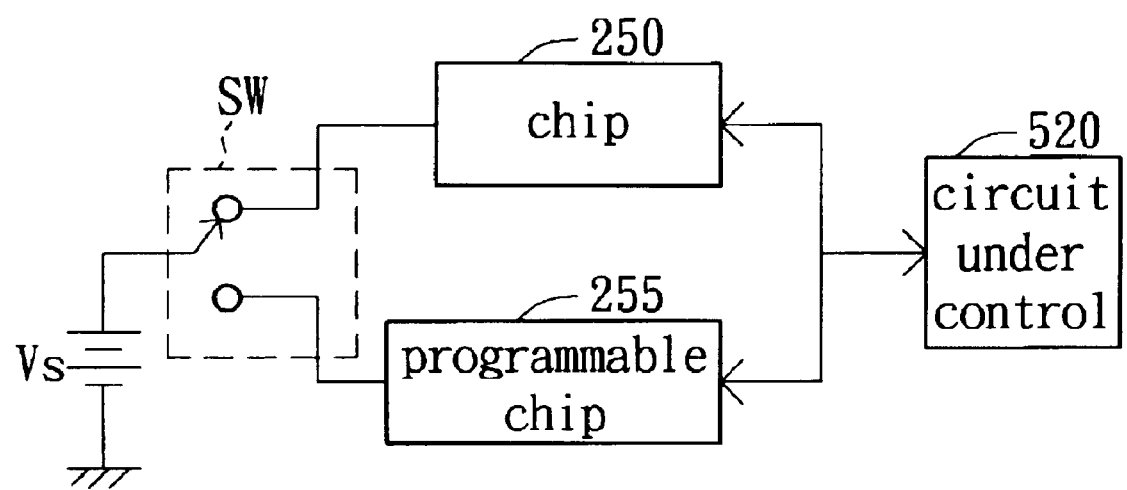
FIG. 5 is a block diagram, schematically illustrating the primary functional circuit board with the capability of verifying the chip function as shown in FIG. 2.

Referring to FIG. 5, it is a block diagram, schematically illustrating the primary functional circuit board with the capability of verifying the chip function as shown in FIG. 2. It is clear that the chip 250 and the programmable chip 255 are coupled to the circuit under control 520. The switching device SW can select the chip 250 or the programmable chip 255 for coupling, so as to enable the selected one and to perform the operation on controlling the circuit under control. Taking the drawing as an example, the switching device SW is coupled to the power source Vs, so that when the switching device SW connects to the chip 250, the chip 250 is then enabled while the programmable chip 255 at this moment is at the disabled status. On the contrary, when the switching device SW connects to the programmable chip 255, the programmable chip 255 is then enabled while the chip 250 at this moment is at the disable status. Therefore, a change in the status of the switching device SW can determine the circuit under control 520. Furthermore, the circuit under control 520 does not detect whether or not the control side has been changed. This also means that the engineer only needs to switch back and forth on the switching device SW, and the difference and the replaceable degree between the FPGA program and the firmware program can be obtained. As a result, the purpose of cross verification in time can be achieved. Also, the chip 250 and the externally connected ROM can be completely and precisely replaced.

The foregoing embodiment of the present invention has disclosed a primary functional circuit board with the capability to verify the chip function by an alternative manner of easily switching between the chip and the programmable chip, and between the firmware program version and the FPGA program version, so as to achieve the effect of cross verification and to reduce the testing time for verifying the function. The chip programmed by the FPGA can successfully and completely replace the original chip which needs an internal ROM program or the ROM program from the external connection. The present invention can achieve the goals of reducing cost and increasing reliability.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A primary functional circuit board with the capability to verify the chip functions by an alternative manner, comprising:

a circuit board;

a chip, having a plurality of functional connection pins disposed on the circuit board;

a plurality of extending connection terminals, disposed on the circuit board and electrically coupled with the plurality of functional connection pins one by one;

a verifying apparatus, implemented on the circuit board, wherein the verifying apparatus comprises:

a substrate, implemented with a plurality of contact terminals, wherein the plurality of contact terminals are respectively coupled with the plurality of extending connection terminals one by one; and a programmable chip, implemented on the circuit board, wherein programmable chip comprises a plurality of connection pins, and the plurality of connection pins are respectively coupled to the plurality of contact terminals one by one; and a switching device, coupled to the chip and the verifying apparatus, so as to select the chip or the programmable chip, so as to enable the selected one.

2. The primary functional circuit board with the capability to verify the chip function by an alternative manner as recited in claim 1, wherein the chip comprises an embedded controller.

3. The primary functional circuit board with the capability to verify the chip function by an alternative manner as recited in claim 1, wherein the programmable chip comprises a field programmable gate array (FPGA).

4. The primary functional circuit board with the capability to verify the chip function by an alternative manner as recited in claim 1, wherein the programmable chip comprises a programmable logic device (PLD).

5. The primary functional circuit board with the capability to verify the chip function by an alternative manner as recited in claim 1, wherein the programmable chip comprises a complex programmable logic device (CPLD).

* * * * *